United States Patent [19]

Kubota et al.

[11] Patent Number: 4,536,419
[45] Date of Patent: Aug. 20, 1985

[54] METHOD FOR FORMING TAPERED FILMS

[75] Inventors: Hitoshi Kubota, Fujisawa; Minoru Tanaka; Susumu Aiuchi, both of Yokohama, all of Japan

[73] Assignee: Hitachi, Ltd., Tokyo, Japan

[21] Appl. No.: 474,032

[22] Filed: Mar. 10, 1983

[51] Int. Cl.³ .................. C23C 11/00; C23C 13/00
[52] U.S. Cl. .................. 427/255.5; 204/192 R; 204/192 N; 427/99; 427/248.1; 427/255.7; 427/282; 427/402
[58] Field of Search .......... 427/96, 86, 99, 272, 427/282, 255.5, 248.1, 255.7, 402; 204/192 R, 192 N

[56] References Cited

U.S. PATENT DOCUMENTS

| | | | |
|---|---|---|---|
| 2,676,114 | 4/1954 | Barkley | 427/248.1 |
| 3,510,340 | 5/1970 | Jones | 427/248.1 |
| 4,273,812 | 6/1981 | Tsutsui et al. | 427/255.5 |
| 4,305,801 | 12/1981 | Patten et al. | 427/255.5 |
| 4,344,988 | 8/1982 | Sono et al. | 427/255.5 |

FOREIGN PATENT DOCUMENTS

| | | | |
|---|---|---|---|
| 0023149 | 1/1981 | European Pat. Off. | 427/248.1 |
| 1021231 | 12/1957 | Fed. Rep. of Germany | 427/255.5 |
| 52-63180 | 5/1977 | Japan | 427/255.5 |
| 52-65183 | 5/1977 | Japan | 427/255.5 |
| 978984 | 1/1965 | United Kingdom | 427/248.1 |
| 1010984 | 11/1965 | United Kingdom | 427/248.1 |
| 1232868 | 5/1971 | United Kingdom | 427/255.5 |

Primary Examiner—S. L. Childs
Attorney, Agent, or Firm—Antonelli, Terry & Wands

[57] ABSTRACT

Method for forming thin films on a substrate by using a mask through dry process wherein the substrate and the mask are moved relative to each other at least once for the formation of a thin film before the thickness of the thin film being formed on the substrate reaches a predetermined value, so that the formed thin film has an outer edge partly or entirely contoured stepwise.

14 Claims, 12 Drawing Figures

METHOD FOR FORMING TAPERED FILMS

The present invention relates to method and apparatus for forming thin films through dry process, especially, suitable for the formation of microelectronic circuits.

For example, technique has hitherto been known wherein a thin film is formed on a surface of an object through dry process such as vacuum vapor deposition, ion plating, sputtering, chemical vapor deposition or molecular beam epitaxy.

In the dry process, a mask having perforations arranged in the same pattern as that of a required thin film is disposed close to a surface of a substrate on which the thin film is to be formed, so that the thin film of the same pattern as that of the perforations can be formed on the substrate.

In the dry process, a film material moving from a material source straight-forwardly toward the substrate partly passes through the perforations of the mask and is deposited on the substrate to form a film. Consequently, the outer edge of the film formed on the substrate stands substantially vertically with respect to the substrate and the film has a rectangular configuration in longitudinal section.

An electrically conductive material is deposited in a required pattern on the substrate made of an insulating material through the dry process to form a wiring section of an electronic circuit such as an integrated circuit. Where the electrically conductive film to be formed has a complicated pattern, the required pattern is divided into a plurality of sub-patterns, sub-masks corresponding to the sub-patterns are prepared, and conductive films of the sub-patterns are sequentially formed on the substrate. When, in such a case, two conductive films which mutually cross or which are laminated are desired to be formed, a preceding conductive film formed on the substrate is partly or entirely covered with an insulating film, and a succeeding conductive film is then formed on the insulating film.

When the insulating film is so formed as to partly (or entirely) cover the preceding conductive film in the formation of the two crossing (or laminated) conductive films, a shoulder having a height equal to a thickness of the preceding conductive film is formed between a portion of the insulating film deposited on the preceding conductive film and another portion thereof deposited on the substrate. As a result, the succeeding conductive film formed on the insulating film also contains a similar shoulder.

Assume now that the preceding conductive film has a thickness $t_1$, the insulating film has a thickness $t_2$ and the succeeding conductive film formed on the insulating film has a thickness $t_3$. Then, when $t_1 > t_2$, the two crossing conductive films are short-circuited to each other. When $t_1 > t_3$, the insulating film formed on the succeeding conductive film is disconnected at the shoulder. When $t_1 = t_2 = t_3$, insulation between the two crossing conductive films becomes unstable and at the same time, electrical conduction in the succeeding conductive film formed on the insulating film becomes unstable because of a shortage of the step coverage of the conductive film. Under these conditions, required electrical characteristics cannot be obtained constantly, thus lowering the yielding rate of products. Therefore, the electrical characteristics can be stabilized and the yielding rate of products can be improved by establishing $t_1 < t_2$ and $t_1 < t_3$ among the thicknesses of the preceding conductive film, insulating film and succeeding conductive film. However, this requires that the thicknesses of the insulating film and the succeeding conductive film formed thereon be increased each portion where the two conductive films mutually cross. Accordingly, working conditions must be changed for each crossing, resulting in degraded workability.

An object of the present invention is to provide a method and apparatus for forming thin films which can ensure crossing and lamination of the thin films without changing the thicknesses of the thin films sequentially formed on a substrate.

Another object of the invention is to provide method and apparatus for forming thin films which can ensure manufacture of products with stable electrical characteristics at a high yielding rate.

Still another object of the invention is to provide a method and apparatus for producing a thin film structure of microelectronic circuits which can form thin films in required patterns without degrading workability.

To accomplish the above objects, according to one aspect of the invention, there is provided a dry-process film-forming method for forming tapered thin films on a substrate by using a mask having a pattern smaller by a taper width than a desired film pattern wherein the substrate and the mask are moved relative to each other at least once intermittently or continuously within the pattern difference (w) for the formation of a thin film until the thickness of the thin film being formed on the substrate reaches a predetermined value, so that the resulting thin film has an outer edge contoured stepwise namely, a substantially-tapered edge.

According to another aspect of the invention, there is provided an apparatus for forming tapered thin films on a substrate by using a mask having a pattern of perforations each having a smaller size than that of a thin film to be formed on the substrate, wherein the apparatus comprises means for moving at least one of the substrate and the mask disposed in the apparatus relative to each other at least once or continuously within the range of the pattern difference until the thickness of the thin film being formed on the substrate reach predetermined values, so that the thin film formed in one pattern has a substantially-stepwise outer edge.

The present invention will be apparent from the following detailed description taken in conjunction with the accompanying drawings, in which.

The invention will now be described by way of example with reference to the accompanying drawings.

Figure 1:
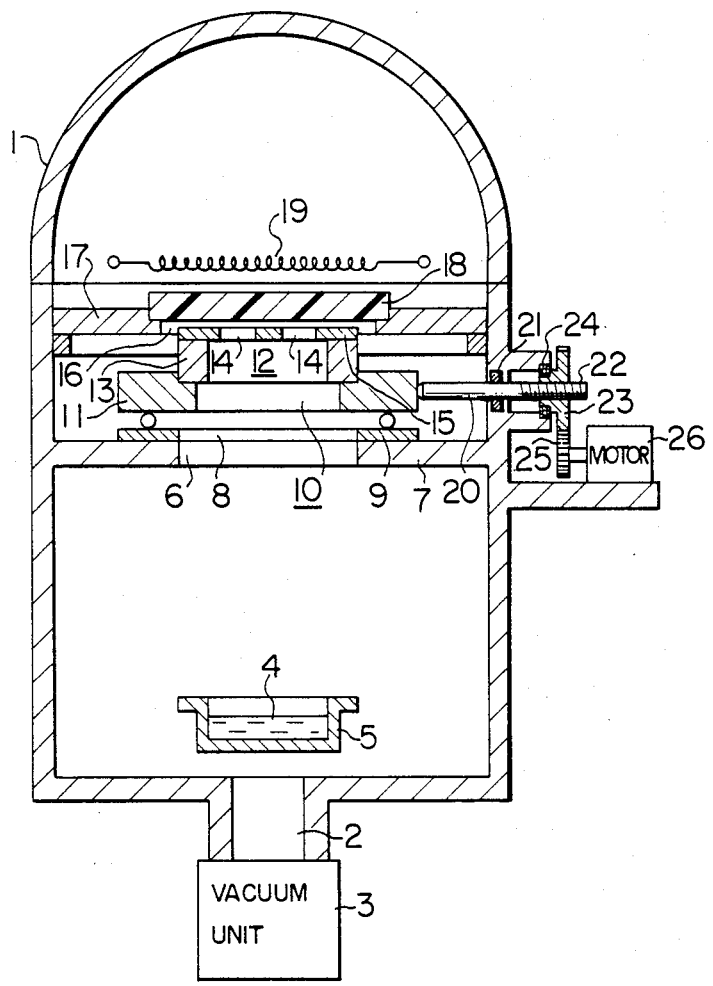
FIG. 1 is a front view, in longitudinal section, of a vacuum evaporator for implementation of the invention in vacuum vapor deposition.

Reference should first be made to FIG. 1. A vacuum evaporator as shown therein has a vacuum vessel or chamber 1 with its inlet/outlet port 2 connected to a vacuum unit 3. When the vacuum unit 3 is operated, atmospheric pressure and evacuated pressure of a predetermined vacuum degree alternately prevail within the vacuum chamber 1. Disposed at the bottom of the vacuum chamber 1 and interiorly thereof is a crucible 5 which contains a material 4 of a film to be formed on a substrate 18. The substrate may be made of insulating material by way of example. However, semiconductor material or conductor material may also be used therefor. The crucible 5 is attached with a heater (not shown) by which the material 4 is heated to evaporate. The vacuum chamber 1 has an internal base disposed at the intermediate of the chamber and having a central opening 6. Mounted on the base 7 is a linear guide 9 having an opening 8 in communication with the opening 6. Slidably mounted on the linear guide 9 is a table 11 having an opening 10 in communication with the openings 6 and 8. Supported by the table 11 is a mask frame 13 having an opening 12 in communication with the openings 6, 8 and 10. Fixedly secured to the mask frame 13 is a mask 15 which is formed with perforations 14 arranged in the same pattern as that of thin films to be formed on the substrate 18, each perforation having a smaller size than that of each thin film. Here, each thin film is 20 to 30μ wide and 1 to 5μ thick, for example. The vacuum chamber 1 also has an interior substrate base 17 disposed in parallel with the base 7 and having an opening 16. The substrate base 17 carries the substrate 18 such that the substrate 18 covers the opening 16 and a surface of the substrate 18 on which the thin films are to be formed opposes the mask 15 at a predetermined spacing. Above the substrate 18 is disposed a heater 19 for heating the substrate 18. The heater 19 is connected to a power supply not shown. The table 11 is biased by a spring not shown so as to abut against one end of a rod 20 which slidably passes through the side wall of the vacuum chamber 1. An O-ring 21 for airtight sealing is applied between the vacuum chamber 1 and rod 20. A portion of the rod 20 extending exteriorly of the vacuum chamber 1 is threaded as designated at 22 and grooved with an axial channel (not shown). A member (not shown) projecting from the outer wall of the vacuum chamber 1 slidably fits in the channel to prevent the rod 20 from being rotated. A gear 24 having an outer gearing and an inner axial gearing which is in mesh with the threading 22 is rotatably supported through a bearing 24 exteriorly of the vacuum chamber 1. A gear 25 in mesh with the outer gearing of the gear 23 is supported by a motor 26 which is fixed to an outer support of chamber 1 as shown in FIG. 1. Used as the motor 26 is a control motor incorporating a known speed reduction mechanism. The rod 20, gears 23 and 25 and motor 26 constitute a drive unit for the table 11. A usual thickness monitor is provided in the chamber.

Figure 2A:
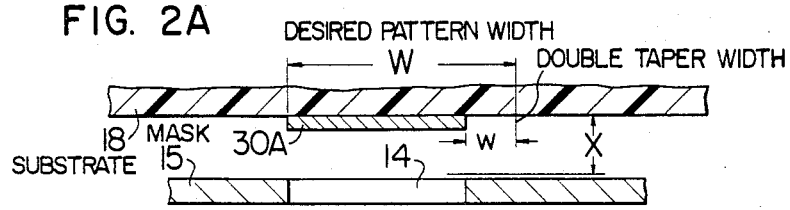
FIGS. 2A to 2E are fragmentary sectional views useful in explaining the steps of thin film formation according to the invention.
Figure 2B:
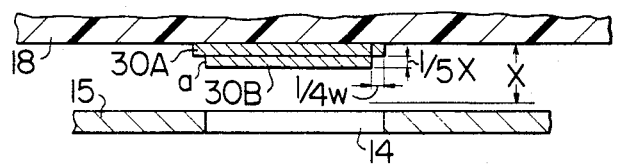
Figure 2C:
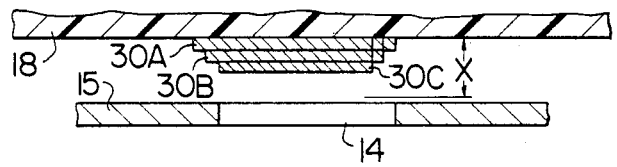
Figure 2D:
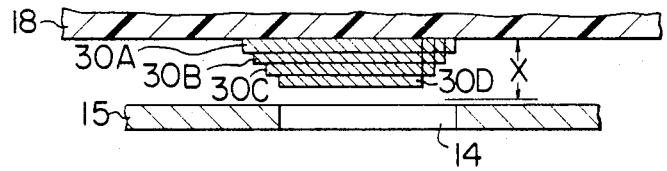
Figure 2E:
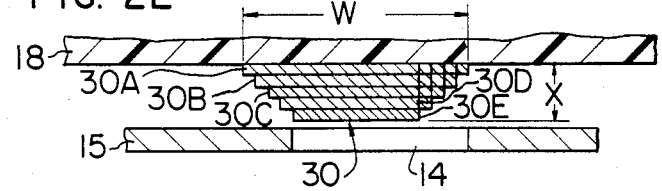

With the above construction, description will be made of the case where each thin film is produced by vapor deposition with the relative position between the mask and the substrate being shifted five times during the deposition. The mask 15 is placed on the table 11 which is positioned at a start position, and the substrate 18 is brought on the substrate base 17. Thereafter, the vacuum unit 3 is operated to evacuate the interior of the vacuum chamber 1 while heating the substrate 18 by means of the heater 19. When the interior of the chamber 1 is evacuated to a predetermined vacuum degree, the crucible 5 is heated to evaporate the material 4 contained in the crucible 5. Vaporized material from the crucible 5 passes through the openings 6, 8, 10, 12 and 14 and is deposited on the substrate 18 as shown in FIG. 2A to form a sub-film 30A. The vaporized material is mainly deposited on the inner wall of the vacuum chamber 1 and the bottom and side surfaces of the base 7, table 11, mask frame 13 and mask 15, and only a portion of the vaporized material having passed through the openings 14 is deposited on the substrate 18. In this manner, when the sub-film 30A reaches a thickness which is 1/5 (0.2μ) of a thickness X (e.g. 1μ) required for a conductive film and a width which is smaller than an ultimate width W by a half taper width w for example, when the taper angle is 45°, w=2μ, the motor 26 is operated to move the table 11 and consequently the mask 15 by ¼ w relative to the substrate. Under this condition, a second sub-film 30B is formed as shown in FIG. 2B. As a result, multishoulders a each having a height 1/5 X and a width ¼ w are formed on opposite sides of the thin films 30A and 30B formed on the substrate 18 in the direction of mask shifting. Thereafter, sub-films 30C, 30D and 30E are sequentially formed on the substrate 18, thereby obtaining a substantially-tapered conductive film 30 of the required thickness X and width W. As can be appreciated, in general each of the sub-films formed will have a thickness of (1/n) (X), with the table moved a distance of (1·n−1) (w) between depositon of each sub-film, where n is the total number of sub-films formed. Instead, a pattern of thin film 30 with stepped outer edges may be produced by vapor deposition with the relative motion between the mask and the substrate being carried out in the range w. Sub-films 30A–30E are continuously and integrally formed of the same material as a single layer 30 but not of a multi-layer structure, in the embodiments.

Figure 3:
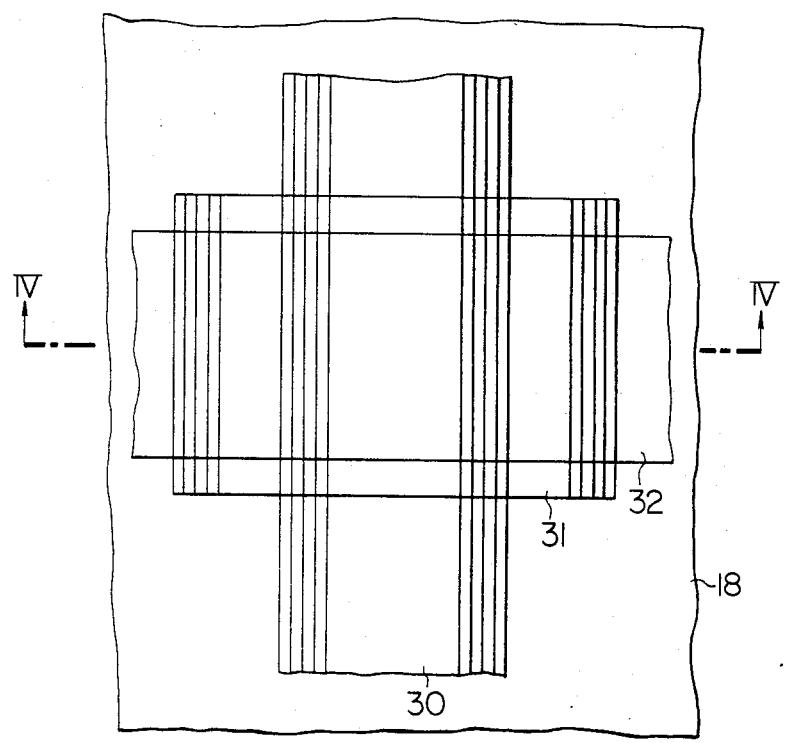
FIG. 3 is a plan view showing a thin film pattern formed according to teachings of the invention.
Figure 4:
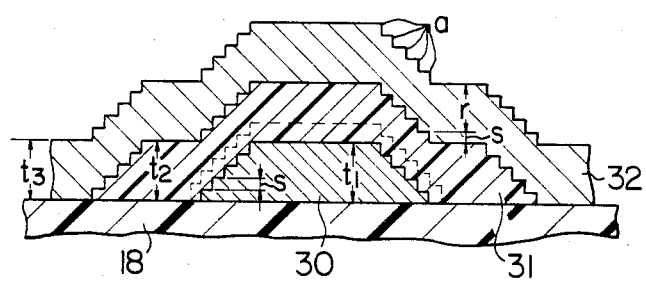
FIG. 4 is a sectional view taken along line IV—IV in FIG. 3.
Figure 5A:
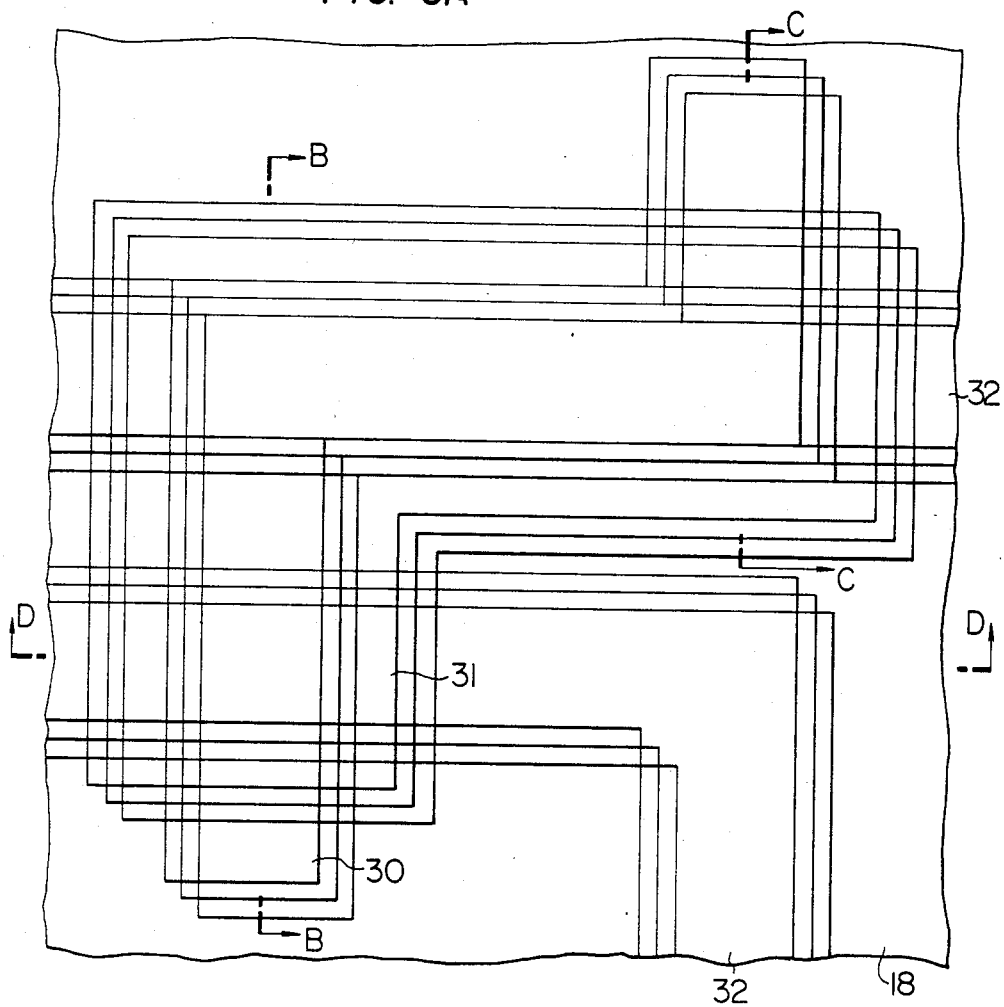
FIG. 5A is a plan view showing another thin film pattern formed according to the invention.
Figure 5B:
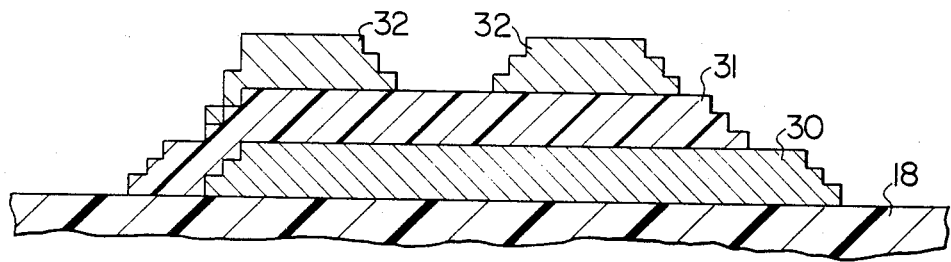
FIG. 5B is a sectional view taken along line B—B in FIG. 5A.
Figure 5C:
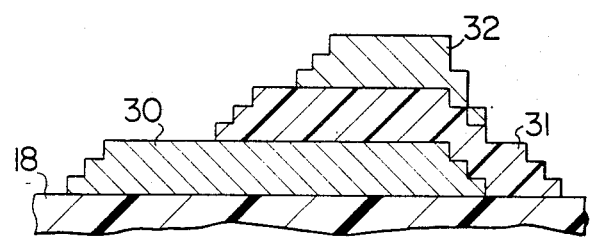
FIG. 5C is a sectional view taken along line C—C in FIG. 5A.
Figure 5D:
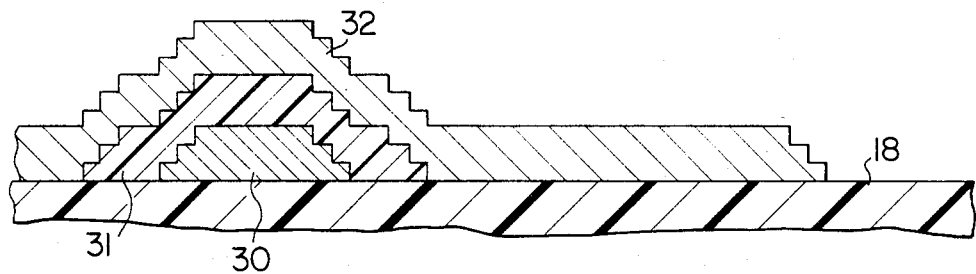
FIG. 5D is a sectional view taken along line D—D in FIG. 5A.

An insulating film 31 is formed on the thus formed preceding conductive film 30, and a succeeding conductive film is formed on the insulating film to complete a pattern structure as shown in FIGS. 3 and 4.

Thus, in the pattern structure of FIGS. 3 and 4, the preceding conductive film 30 is first formed on the substrate 18 through the steps of FIGS. 2A to 2E, the insulating film 31 is then formed on the conductive film 30 through similar steps to partly cover the film 30, and finally, a succeeding conductive film 32 is formed on the insulating film 31 to extend thereacross. In the above process, it is not always necessary to form the conductive film 32 through the steps of FIGS. 2A to 2E but the film 32 may be formed to the ultimate thickness through one step of vapor deposition without the shifting of the mask or the substrate.

The conductive film 32 has, at the shoulders a, a bridging r which is a difference between the thickness $t_3$ of conductive film 32 and a height S of the shoulder. For example, where the conductive film 30 is formed of five layers each having a thickness which is 1/5 of the thickness $t_1$ of film 30 and the insulating film 31 is uniformly formed thereon to the thickness $t_2$, the height S in the preceding conductive film 30 is equal to that in the succeeding conductive film 32. Consequently, the bridging r in the conductive film 32 is expressed as, $$r = t_3 - S = t_3 - 1/5 t_3 = 4/5 t_3 \qquad (1),$$

thus ensuring the bridging r which amounts up to 80% of the thickness $t_3$ of conductive film 32. This holds true for the insulating film 31.

It is not always necessary that the thickness of the insulating film 31 and the conductive film 30 be equal but essentially, the thickness $t_2$ of the overlying insulating film 31 must be larger than the height S as shown at dotted lines in FIG. 4. Where the insulating film 31 is thin or the entire conductive film 32 is formed on the insulating film 31, the insulating film 31 may be formed through one step of vapor deposition.

Referring now to FIGS. 5A to 5D, there is shown another thin film pattern structure wherein the relative movement between the mask 15 and the substrate 18, though effected in one direction in the steps of FIGS. 2A to 2E, is carried out in two directions to sequentially form a conductive film 30, an insulating film 31 and a conductive film 32 on the substrate 18.

With this construction, the conductive film 32 formed on the insulating film 31 can extend across the insulating film 31 in desired directions, thereby improving freedom of circuit design to make it possible to form more complicated circuits.

For the relative movement of mask 15 and substrate 18 in the two directions, two drive units operable in these directions may be used. The desired pattern width W is usually 20 to 30$\mu$ in the fabrication of hybrid components and the taper width w/2 is generally determined to make a taper angle of up to 70° between the substrate plane and the thickness of each tapered film. The spacing or gap between the mask and the substrate is to be held at most about 100$\mu$ for practical use. According to the invention, the step coverage of a conductor circuit in a multi-layered circuit structure can be improved up to at least 80% with taper control.

What is claimed is:

1. A method for producing multiple layers, including a tapered thin film as a lower layer thereof, on a substrate by dry process comprising:
    using a mask having a pattern with a smaller dimension by a pattern difference than a desired pattern of the thin film, said pattern having the smaller dimension at least in the direction of the taper to be formed;
    carrying out a relative motion between said substrate and said mask disposed close to the substrate within the range of said desired pattern, in the direction of said taper to be formed;
    forming a thin film on said substrate by vapor deposition in association with said relative motion to thereby produce a substantially-tapered, vapor-deposited thin film; and
    forming at least one layer on said substantially-tapered, vapor-deposited thin film.

2. A method according to claim 1, wherein said relative motion is carried out intermittently during the vapor-deposition.

3. A method according to claim 1, wherein said relative motion is carried out continuously during the vapor-deposition.

4. A method for forming multiple layers, including a thin film of a desired pattern as a lower layer on a substrate, by using a mask through dry process, comprising the steps of:
    placing said mask and said substrate with a predetermined distance therebetween in opposed relation with each other, said mask having an aperture pattern smaller by a pattern difference (w) than at least one dimension of said desired pattern of the thin film;
    effecting a first one of multiple depositions on the substrate through said mask;
    changing the relative position between the mask and the substrate, by a distance smaller than said pattern difference, in the direction of the at least one thin film pattern dimension, each time each of the multiple depositions is completed;
    effecting the succeeding one of said multiple depositions on the substrate, whereby the thin film, having a tapered edge in the direction of said thin film pattern dimension, is formed by said multiple depositions; and
    forming at least one layer on said thin film having a tapered edge.

5. A method according to claim 4, wherein each of the succeeding ones of the multiple depositions is performed after changing the relative position between the mask and substrate, whereby the thin film having a stepped edge in the direction of the thin film pattern dimension is formed.

6. A method according to claim 5, wherein the relative positioning is changed to provide n total multiple depositions, with the relative position changed by a distance $$\left(\frac{1}{n-1}\right)(w)$$

for each deposition.

7. A method according to claim 6, wherein the thin film has a total thickness (X), with the partial thickness formed at each of said multiple depositions being $$\left(\frac{1}{n}\right)(X).$$

8. A method according to claim 4, wherein the multiple depositions are performed by vapor deposition.

9. A method according to claim 4, wherein the taper angle between the substrate plane and the formed thin film is at most 70°.

10. A method according to claim 9, wherein the predetermined distance is at most about 100$\mu$.

11. A method according to claim 4, wherein the mask has an aperture pattern smaller by pattern differences than two dimensions of said desired pattern of the thin film, and wherein the relative position between the mask and substrate is changed in the directions of each of said two dimensions, whereby the thin film is tapered in two directions.

12. A method according to claim 1, wherein two layers are formed on said substantially-tapered, vapor deposited thin film, with a first layer being formed on said substantially-tapered vapor deposited film and a second layer being formed on said first layer.

13. A method according to claim 12, wherein said substantially-tapered, vapor-deposited thin film is made of an electrically conductive material, said first layer is made of an insulating material, and said second layer is made of an electrically conductive material.

14. A method according to claim 13, wherein the first layer is also made by said using a mask, said carrying out a relative motion and said forming a thin film.

* * * * *